(12) United States Patent
Maeda et al.

(10) Patent No.: US 10,861,680 B2
(45) Date of Patent: Dec. 8, 2020

(54) WAFER SUPPORT

(71) Applicant: NGK INSULATORS, LTD., Nagoya (JP)

(72) Inventors: Daiki Maeda, Nagoya (JP); Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 215 days.

(21) Appl. No.: 15/878,532

(22) Filed: Jan. 24, 2018

(65) Prior Publication Data

US 2018/0218885 A1     Aug. 2, 2018

(30) Foreign Application Priority Data

Jan. 30, 2017    (JP) ................. 2017-013980

(51) Int. Cl.
| | |
|---|---|
| *H01J 37/32* | (2006.01) |
| *H01L 21/67* | (2006.01) |
| *H01L 21/683* | (2006.01) |
| *C23C 16/458* | (2006.01) |
| *C23C 16/505* | (2006.01) |
| *C23C 16/509* | (2006.01) |

(52) U.S. Cl.
CPC .... *H01J 37/32724* (2013.01); *C23C 16/4586* (2013.01); *C23C 16/505* (2013.01); *C23C 16/5096* (2013.01); *H01J 37/32559* (2013.01); *H01L 21/67103* (2013.01); *H01L 21/6831* (2013.01); *H01L 21/6833* (2013.01); *H01J 37/32082* (2013.01); *H01J 2237/0266* (2013.01); *H01J 2237/334* (2013.01); *H01J 2237/3321* (2013.01)

(58) Field of Classification Search
USPC ................ 156/345.51–345.55; 118/728–730; 361/234
See application file for complete search history.

(56) References Cited

U.S. PATENT DOCUMENTS

| | | | |
|---|---|---|---|
| 6,432,208 B1 * | 8/2002 | Kawakami | C23C 16/4586 118/724 |
| 6,683,274 B1 | 1/2004 | Kwon et al. | |

(Continued)

FOREIGN PATENT DOCUMENTS

| | | |
|---|---|---|
| JP | H02-129373 A1 | 5/1990 |
| JP | H10-204645 A1 | 8/1998 |
| JP | 2009-272657 A1 | 11/2009 |

OTHER PUBLICATIONS

Japanese Office Action (Application No. 2017-013980) dated Jun. 25, 2019 (with English translation).

*Primary Examiner* — Rakesh K Dhingra
(74) *Attorney, Agent, or Firm* — Burr & Brown, PLLC

(57) ABSTRACT

A wafer support of the present invention includes shield sheet embedded in the ceramic base between the plasma generation electrode and the heater electrode in a state not contacting both the electrodes; and a shield pipe electrically connected to the shield sheet and laid to extend to outside of the ceramic base from the surface of the ceramic base on the side opposite to the wafer placement surface, wherein the wiring member for the plasma generation electrode is inserted through inside of the shield pipe in a state not contacting the shield pipe, and the wiring member for the heater electrode is disposed outside the shield pipe in a state not contacting the shield pipe.

5 Claims, 2 Drawing Sheets

(56) References Cited

U.S. PATENT DOCUMENTS

| | | | |
|---|---|---|---|
| 2004/0255863 A1* | 12/2004 | Higashiura | H01J 37/32082 |
| | | | 118/723 E |
| 2006/0060141 A1 | 3/2006 | Kamaishi et al. | |
| 2006/0272774 A1* | 12/2006 | Maehara | H01L 21/68757 |
| | | | 156/345.28 |
| 2009/0314208 A1* | 12/2009 | Zhou | H01L 21/68792 |
| | | | 118/723 R |
| 2013/0002137 A1* | 1/2013 | Tanibata | H05H 1/46 |
| | | | 315/111.21 |
| 2017/0306494 A1* | 10/2017 | Lin | C23C 16/46 |

* cited by examiner

WAFER SUPPORT

BACKGROUND OF THE INVENTION

1. Field of the Invention

The present invention relates to a wafer support.

2. Description of the Related Art

Hitherto, a plasma CVD step has often been employed in a semiconductor manufacturing process. In the plasma CVD step, a wafer is placed on a wafer placement surface of a wafer support. A lower electrode connected to a ground and a heater electrode for heating the wafer are both embedded in a ceramic base of the wafer support. On the other hand, an upper electrode connected to an RF power supply is disposed in a space above the wafer. When an RF current is supplied to the upper electrode, plasma is generated in a space between the upper electrode and the lower electrode, and a thin film is vapor-deposited on the wafer with the aid of the plasma. In some cases, the lower electrode may be connected to the RF power supply, and the upper electrode may be connected to the ground.

In the above-described plasma CVD step, an RF electric field is induced due to temporal change of an RF magnetic field that is generated by the RF current, and the heater electrode is affected by RF noise depending on situations. Taking the above point into consideration, Patent Literature (PTL) 1 proposes that an RF shield is disposed between the lower electrode and the heater electrode.

CITATION LIST

Patent Literature

[PTL 1] U.S. Pat. No. 6,683,274

SUMMARY OF THE INVENTION

Even with the RF shield disposed between the lower electrode and the heater electrode, however, it is difficult to sufficiently prevent the influence of the RF noise upon a heater circuit when the frequency of the RF current is high.

The present invention has been made to deal with the above-mentioned problem, and a main object of the present invention is to sufficiently prevent the influence of the RF noise upon the heater circuit in the wafer support used in a plasma generation apparatus.

The present invention provides a wafer support in which a plasma generation electrode and a heater electrode are embedded in a ceramic base having a wafer placement surface successively in named order from the side closer to the wafer placement surface in a state spaced from each other, and in which a wiring member for the plasma generation electrode and a wiring member for the heater electrode are laid to extend to the outside of the ceramic base from a surface of the ceramic base on the side opposite to the wafer placement surface, the wafer support including:
a shield sheet embedded in the ceramic base between the plasma generation electrode and the heater electrode in a state not contacting both the electrodes; and
a shield pipe electrically connected to the shield sheet and laid to extend to the outside of the ceramic base from the surface of the ceramic base on the side opposite to the wafer placement surface, wherein the wiring member for the plasma generation electrode is inserted through the inside of the shield pipe in a state not contacting the shield pipe, and
the wiring member for the heater electrode is disposed outside the shield pipe in a state not contacting the shield pipe.

In the wafer support described above, the shield sheet prevents an RF electric field, which is generated around the plasma generation electrode, from coupling with the heater electrode. That RF electric field is induced due to temporal change of an RF magnetic field that is generated by an RF current flowing in the plasma generation electrode. Furthermore, the shield pipe prevents an RF electric field, which is generated around the wiring member for the plasma generation electrode, from coupling with the heater electrode. That RF electric field is induced due to temporal change of an RF magnetic field that is generated by an RF current flowing in the wiring member for the plasma generation electrode. In PTL 1, because of not including the shield pipe, the RF electric field cannot be prevented from coupling with the wiring member for the heater electrode. In the present invention, however, because of including the shield pipe, the RF electric field can be prevented from coupling with the wiring member for the heater electrode. As a result, the present invention can sufficiently prevent the influence of RF noise upon a heater circuit that includes the heater electrode and the wiring member for the heater electrode.

In the wafer support according to the present invention, the wiring member for the heater electrode may include a low pass filter between the heater electrode and an external power supply. In that case, the RF noise that cannot be prevented by the low pass filter can be prevented with the presence of the shield sheet and the shield pipe.

In the wafer support according to the present invention, the shield sheet may be a planar member made of a mesh, a punching metal, or a metal plate, and the shield pipe may be a tubular member made of a mesh, a punching metal, or a metal plate. The mesh size or the size of holes in the punching metal is designed to be able to sufficiently prevent the influence of the RF noise.

In the wafer support according to the present invention, the plasma generation electrode may be an electrode for applying a voltage of an RF power supply, or a ground electrode. Since the problem of RF noise occurs regardless of the type of the plasma generation electrode, application of the present invention to any of those cases is highly significant.

In the wafer support according to the present invention, a frequency of an RF current flowing in the plasma generation electrode is preferably 13 MHz or higher. When the frequency of the RF current is 13 MHz or higher (particularly 27 MHz or higher), the influence of the RF noise tends to increase. Hence application of the present invention to that case is highly significant.

DETAILED DESCRIPTION OF THE INVENTION

Figure 1:
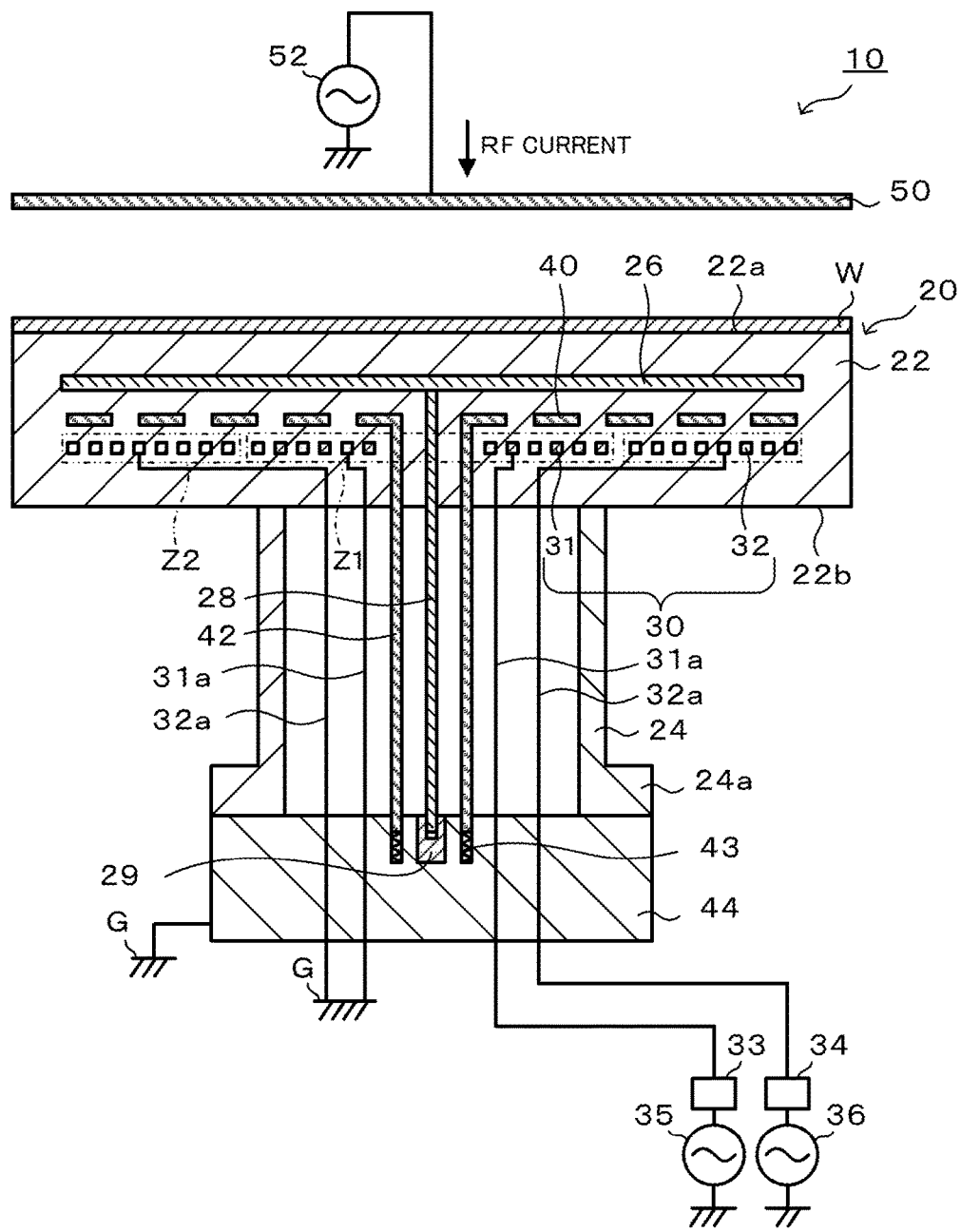
FIG. 1 is a sectional view illustrating, in simplified form, a configuration of a plasma generation apparatus 10 according to an embodiment.

Preferred embodiments of the present invention will be described below with reference to the drawings. FIG. 1 is a sectional view illustrating, in simplified form, a configuration of a plasma generation apparatus 10.

The plasma generation apparatus 10 includes a wafer support 20 and an upper electrode 50.

The wafer support 20 is used to support and heat a wafer W for carrying out CVD, etching, etc. on the wager W with the aid of plasma, and it is mounted inside a not-illustrated chamber for a semiconductor process. The wafer support 20 includes a ceramic base 22 and a ceramic shaft 24.

The ceramic base 22 is a disk-shaped member made of AlN. The ceramic base 22 has a wafer placement surface 22*a* on which the wafer W can be placed. The ceramic shaft 24 is bonded to a surface (rear surface) 22*b* of the ceramic base 22 on the side opposite to the wafer placement surface 22*a*. A plasma generation electrode 26, a heater electrode 30, and a shield sheet 40 are embedded in the ceramic base 22. The plasma generation electrode 26 and the shield sheet 40 are disposed successively in named order from the side closer to the wafer placement surface 22*a* in a state spaced from each other. The shield sheet 40 is embedded in the ceramic base 22 between the plasma generation electrode 26 and the heater electrode 30 in a state not contacting them.

The plasma generation electrode 26 is a circular electrode formed of a conductive mesh sheet, and is disposed parallel or substantially parallel to the wafer placement surface 22*a*. A rod 28 serving as a wiring member, which is electrically connected to the plasma generation electrode 26, is laid to extend to the inside of the ceramic shaft 24 (i.e., to the outside of the ceramic base 22) from the rear surface 22*b* of the ceramic base 22, and it is electrically connected to a circular columnar member 44 made of a conductive metal.

The heater electrode 30 is disposed parallel or substantially parallel to the wafer placement surface 22*a*. The heater electrode 30 is constituted by a first heater electrode 31 that is disposed in a zone (first zone Z1, see a one-dot-chain line in FIG. 1) inside a circle of a predetermined radius about a center of the ceramic base 22, and by a second heater electrode 32 that is disposed in a zone (second zone Z2, see a two-dot-chain line in FIG. 1) outside the above-mentioned circle. The first heater electrode 31 is formed by laying out a coil to extend from one terminal to the other terminal over a substantially entire surface of the first zone Z1 except for the center in a traversable pattern drawn with one stroke. Wiring members 31*a* and 31*a* are electrically connected to the two terminals of the first heater electrode 31. One wiring member 31*a* is laid to extend to the inside of the ceramic shaft 24 (i.e., to the outside of the ceramic base 22) from the rear surface 22*b* of the ceramic base 22, and after penetrating through the circular columnar member 44 in an electrically insulated state, it is connected to an AC power supply 35 via a low pass filter 33. The other wiring member 31*a* is electrically connected to a ground G. The second heater electrode 32 is formed by laying out a coil over a substantially entire surface of the second zone Z2 in a traversable pattern drawn with one stroke. Wiring members 32*a* and 32*a* are electrically connected to two terminals of the second heater electrode 32. One wiring member 32*a* is laid to extend to the inside of the ceramic shaft 24 (i.e., to the outside of the ceramic base 22) from the rear surface 22*b* of the ceramic base 22, and after penetrating through the circular columnar member 44 in an electrically insulated state, it is connected to an AC power supply 36 via a low pass filter 34. The other wiring member 32*a* is electrically connected to the ground G.

The shield sheet 40 is a circular conductive mesh sheet and is disposed parallel or substantially parallel to the wafer placement surface 22*a*. A diameter of the shield sheet 40 is the same as or slightly larger than that of the plasma generation electrode 26. A mesh size of the shield sheet 40 is set to 0.7 mm or less, for example, to be able to provide a later-described effect, i.e., an effect of preventing an RF electric field from coupling with the first and second heater electrodes 31 and 32. A shield pipe 42 electrically connected to the shield sheet 40 is laid to extend to the inside of the ceramic shaft 24 (i.e., to the outside of the ceramic base 22) from the rear surface 22*b* of the ceramic base 22, and it is electrically connected to the circular columnar member 44. The shield pipe 42 is a conductive mesh pipe and is laid to extend out from the rear surface 22*b* after passing through the center of the ceramic base 22 or its vicinity where the first heater electrode 31 is not laid. Therefore, the shield pipe 42 is not in contact with the heater electrode 30. A mesh size of the shield pipe 42 is set to 0.7 mm or less, for example, to be able to a later-described effect, i.e., an effect of preventing an RF electric field from coupling with the wiring members 31*a* and 32*a* for the first and second heater electrodes 31 and 32. The rod 28 extending from the plasma generation electrode 26 is inserted through the inside of the shield pipe 42 in a state not contacting the shield pipe 42.

The plasma generation electrode 26, the heater electrode 30, the shield sheet 40, and the shield pipe 42 may be made of the same material or different materials. The material(s) is not limited to particular one insofar as being electrically conductive. Examples of the material(s) are Mo, W, Nb, a Mo compound, a W compound, and an Nb compound. Among those examples, the material exhibiting a small difference in thermal expansion coefficient with respect to the ceramic base 22 is preferable. Although the above point is similarly applied to materials of the rod 28 and the wiring members 31*a* and 32*a*, a material having oxidation resistance, such as Ni, is preferable for them.

The ceramic shaft 24 is a cylindrical member made of AlN as with the ceramic base 22. An upper end surface of the ceramic shaft 24 is bonded to the rear surface 22*b* of the ceramic base 22 by diffusion bonding or TCB (thermal compression bonding). The term "TCB" implies a known method of holding a metal bonding material between two members to be bonded, and pressure-bonding those two members in a state where the two members are heated to a temperature not higher than the solidus temperature of the metal bonding material. A flange 24*a* is provided around a lower opening of the ceramic shaft 24.

The flange 24*a* of the ceramic shaft 24 is connected to the circular columnar member 44 that is made of a conductive metal and that is connected to the ground G. An upper surface and a bottom surface of the circular columnar member 44 have a diameter equal to or larger than an outer diameter of the flange 24*a*. A metal-made socket 29 is embedded in a circular hole formed in the upper surface of the circular columnar member 44, and a lower end of the rod 28 is bonded to the socket 29. A bellows 43 in the form of a metal-made expansive pipe is disposed in a ring-shaped hole formed in the upper surface of the circular columnar member 44, and a lower end of the shield pipe 42 is bonded to an upper end of the bellows 43. Thus, the rod 28 is electrically connected to the ground G via both the socket 29 and the circular columnar member 44, while the shield pipe 42 is electrically connected to the ground G via both the bellows 43 and the circular columnar member 44.

The upper electrode 50 is fixed to an upper position facing the wafer placement surface 22*a* of the ceramic base 22 (e.g., to a ceiling surface of the not-illustrated chamber). The upper electrode 50 is connected to an RF power source 52.

Thus, an RF current is supplied to the upper electrode 50. The RF current has a frequency of 13 MHz or 27 MHz, for example.

A usage example of the plasma generation apparatus 10 will be described below. The plasma generation apparatus 10 is arranged inside the not-illustrated chamber, and the wafer W is placed on the wafer placement surface 22a. Then, the RF current is supplied to the upper electrode 50. As a result, plasma is generated between parallel plate electrodes, which are constituted by the upper electrode 50 and the plasma generation electrode 26 embedded in the ceramic base 22. Film forming by CVD and etching are performed on the wafer W with the aid of the generated plasma. In addition, a temperature of the wafer W is determined on the basis of a detection signal from a not-illustrated thermocouple, and voltages supplied to the first and second heater electrodes 31 and 32, which constitute the heater electrode 30, are controlled such that the temperature of the wafer W is held at a setting temperature (e.g., 350° C. or 300° C.).

Around the plasma generation electrode 26, an RF electric field is induced due to temporal change of an RF magnetic field that is generated by the RF current flowing in the plasma generation electrode 26. The shield sheet 40 prevents that RF electric field from coupling with the first and second heater electrodes 31 and 32 that constitute the heater electrode 30. Furthermore, around the rod 28 of the plasma generation electrode 26, an RF electric field is induced due to temporal change of an RF magnetic field that is generated by the RF current flowing in the rod 28. The shield pipe 42 prevents that RF electric field from coupling with the wiring members 31a and 32a for the first and second heater electrodes 31 and 32. It is hence possible to sufficiently prevent the influence of RF noise upon the heater circuit including the first and second heater electrodes 31 and 32 and the wiring members 31a and 32a for those electrodes. As a result, temperature control of the heater electrode 30 can be performed with good accuracy.

An example of manufacturing the plasma generation apparatus 10 will be described below. Here, an example of manufacturing the wafer support 20 is described. It is to be noted that the manufacturing example is briefly described because the manufacturing example can be carried out using the known techniques.

First, into ceramic powder prepared in required specifications, the heater electrode 30 (including the first and second heater electrodes 31 and 32), the shield sheet 40, and the plasma generation electrode 26 are buried in a substantially parallel and mutually non-contact state. The ceramic powder including those components is press-molded by a molding machine. After carrying a molded body thus obtained into a firing furnace, the molded body is fired in the firing furnace that is heated to a predetermined temperature (2000° C. or less). With the firing, the ceramic base 22 is obtained in which the heater electrode 30, the shield sheet 40, and the plasma generation electrode 26 are embedded in the substantially parallel and mutually non-contact state. The firing furnace may be, for example, a hot press furnace or an atmosphere furnace. The ceramic base 22 thus obtained is subjected to surface machining, whereby the ceramic base 22 is shaped into the predetermined dimensions.

Apart from the ceramic base 22, the ceramic shaft 24 is prepared. More specifically, a molded body is obtained by molding ceramic power with CIP (cold isostatic pressing) using a mold for the ceramic shaft, and the obtained molded body is fired in an atmosphere furnace at a predetermined temperature (2000° C. or less). The ceramic shaft 24 thus obtained is subjected to surface machining, whereby the ceramic shaft 24 is shaped into the predetermined dimensions.

Then, the ceramic shaft 24 is arranged at the rear surface 22b of the ceramic base 22, and both the members are bonded to each other by the diffusion bonding or TCB as described above. As a result, the ceramic base 22 and the ceramic shaft 24 are bonded into an integral unit. A surface of the integral unit thus obtained is subjected to finish machining, whereby the integral unit is shaped into the predetermined dimensions. Then, a counterbore is formed in the rear surface 22b of the ceramic base 22 to make the plasma generation electrode 26 exposed, and the rod 28 is bonded to an exposed portion of the plasma generation electrode 26 by brazing, for example. Bonding between the shield sheet 40 and the shield pipe 42, and bonding between the first and second heater electrodes 31, 32 and the wiring members 31a, 32a are also performed by brazing, for example, as in the case of the rod 28. Thereafter, the rod 28 and the shield pipe 42 are connected to the ground G via the circular columnar member 44. Moreover, the one wiring members 31a and 32a are connected to the AC power supplies 35 and 36 via the low pass filters 33 and 34, respectively, and the other wiring members 31a and 32a are connected to the ground G. The wafer support 20 is thus obtained.

In the wafer support 20 described in detail above, the shield sheet 40 prevents the RF electric field, which is generated around the plasma generation electrode 26, from coupling with the first and second heater electrodes 31 and 32. Furthermore, the shield pipe 42 prevents the RF electric field, which is generated around the rod 28, from coupling with the wiring members 31a and 32a for the first and second heater electrodes 31 and 32. It is hence possible to sufficiently prevent the influence of RF noise upon the heater circuit including the first and second heater electrodes 31 and 32 and the wiring members 31a and 32a for those electrodes. As a result, temperature control of the first and second heater electrodes 31 and 32 can be performed with good accuracy.

The wafer support 20 includes, in addition to the shield sheet 40 and the shield pipe 42, the low pass filters 33 and 34 in association respectively with the wiring members 31a and 32a for the first and second heater electrodes 31 and 32. Therefore, the influence of the RF noise upon the heater circuit can be prevented more reliably. Stated in another way, the RF noise that cannot be prevented by the low pass filters 33 and 34 can be prevented with the presence of the shield sheet 40 and the shield pipe 42. In the case where the frequency of the RF current is 13 MHz or higher, particularly 27 MHz or higher, the above-described effect is more significant.

It is needless to say that the present invention is not limited to the above-described embodiment, and that the present invention can be implemented in various embodiments insofar as falling within the technical scope of the present invention.

Figure 2:
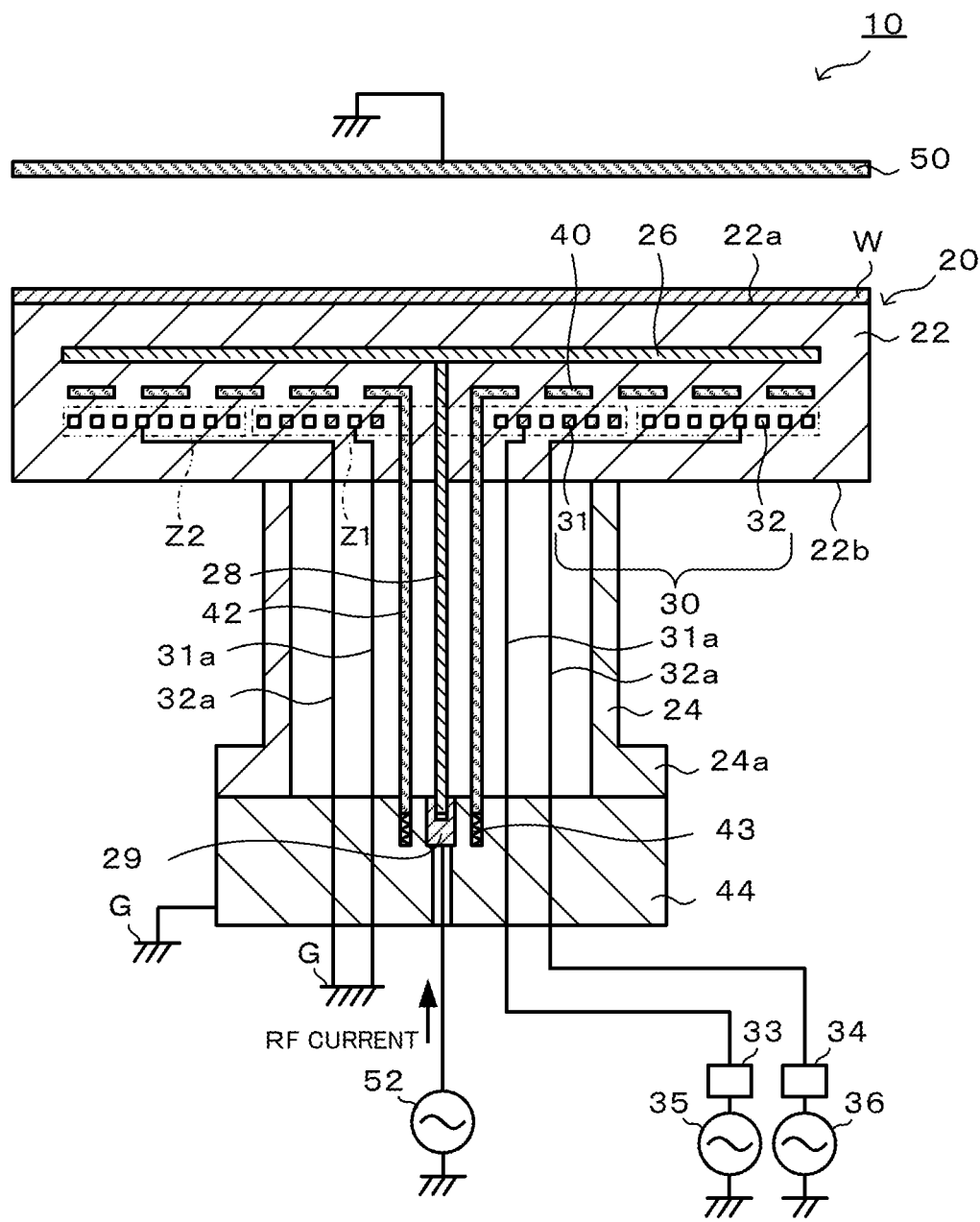
FIG. 2 is a sectional view illustrating, in simplified form, a configuration of a plasma generation apparatus 10 according to another embodiment.

For instance, while, in the above-described embodiment, the upper electrode 50 is connected to the RF power supply 52 and the rod 28 of the plasma generation electrode 26 is connected to the ground G, the upper electrode 50 may be connected to the ground G and the rod 28 of the plasma generation electrode 26 may be connected to the RF power supply 52 via the socket 29, as illustrated in FIG. 2. Reference signs in FIG. 2 denote the same components as those in the above-described embodiment. In the case of FIG. 2, the surroundings of the socket 29 are covered with a not-illustrated insulating film such that the socket 29 is electrically insulated from the circular columnar member 44. Even with that case, similar advantageous effects to those in the above-described embodiment can be obtained.

While, in the above-described embodiment, the ceramic base 22 and the ceramic shaft 24 are made of AlN, materials of those members are not particularly limited to such an example. As another example, alumina, silicon carbide, silicon nitride, or the like may also be used.

In the above-described embodiment, the wafer W can be attracted to the wafer placement surface 22a by applying a voltage to the plasma generation electrode 26. An electrostatic electrode may be further embedded in the ceramic base 22, and a wiring member for the electrostatic electrode may be laid to extend to the inside of the ceramic shaft 24 (i.e., to the outside of the ceramic base 22) from the rear surface 22b of the ceramic base 22. With such a configuration, the wafer W can be attracted to the wafer placement surface 22a by applying a voltage to the electrostatic electrode. A wiring member for the electrostatic electrode is preferably disposed outside the shield pipe 42.

While, in the above-described embodiment, the conductive mesh sheet and mesh pipe are used respectively as the shield sheet 40 and the shield pipe 42, materials of those members are not particularly limited to those examples. A sheet and a pipe of a punching metal, for example, may be used instead. In that case, the size of holes in the punching metal is designed to be able to sufficiently prevent the influence of the RF noise. As an alternative, a planar member and a tubular member of a metal plate may be used. In that case, the influence of the RF noise can be prevented more reliably.

In the above-described embodiment, the low pass filters 33 and 34 are used in addition to the shield sheet 40 and the shield pipe 42, and by designing the low pass filters 33 and 34 as appropriate, the influence of the RF noise upon the heater circuit can be prevented to some extent in the case of supplying the RF current at the frequency of a level of 13 MHz even with a configuration not including the shield sheet 40 and the shield pipe 42. However, the influence of the RF noise can be prevented more reliably by embedding the shield sheet 40 and mounting the shield pipe 42 in and to the ceramic base 22 as described above.

While, in the above-described embodiment, the low pass filters 33 and 34 are disposed respectively in association with the wiring members 31a and 32a, the low pass filters 33 and 34 may be omitted when the influence of the RF noise can be sufficiently prevented with the presence of the shield sheet 40 and the shield pipe 42.

While, in the above-described embodiment, the heater electrode 30 is constituted, by way of example, as a two-zone heater including the first and second heater electrodes 31 and 32, the heater electrode 30 is not particularly limited to such an example. Alternatively, the heater electrode 30 may be a one-zone heater or a multi-zone heater having three or more divided zones.

The present application claims priority of Japanese Patent Application No. 2017-013980 filed on Jan. 30, 2017, the entire contents of which are incorporated herein by reference.

What is claimed is:

1. A wafer support comprising:
   a ceramic base having an upper surface defining a wafer placement surface and a lower surface opposing the wafer placement surface;
   a plasma generation electrode embedded in the ceramic base proximate the wafer placement surface;
   a shield sheet embedded in the ceramic base between the plasma generation electrode and the lower surface;
   at least one heater electrode embedded in the ceramic base between the shield sheet and the lower surface;
   a conductive mesh shield pipe electrically connected to the shield sheet, having an outer peripheral surface and an inner peripheral surface, the inner peripheral surface defining a first space, and extending from the shield sheet through the lower surface of the ceramic base;
   a shaft supporting the ceramic base and provided around the conductive mesh shield pipe, the shaft defining a second space between the shaft and the conductive mesh shield pipe, a bottom end of the shaft being supported on a columnar member, wherein the columnar member is conductive;
   a conductive rod extending through the first space within the conductive mesh shield pipe, having a proximal end and a distal end, the proximal end being electrically connected to the plasma generation electrode;
   a conductive socket embedded in an upper surface of the columnar member receiving therein the distal end of the conductive rod;
   a conductive expansion bellows disposed around the conductive socket in a ring-shaped hole in the upper surface of the columnar member and electrically connected to the bottom of the conductive mesh shield pipe;
   a first wiring member electrically connected to the at least one heater electrode and extending through the second space within the shaft and spaced away from contact with the conductive mesh shield pipe; and
   at least one second wiring member electrically connected to the at least one heater electrode extending through the second space within the shaft and spaced away from contact with the conductive mesh shield pipe;
   wherein the conductive mesh shield pipe comprises a material configured to prevent an RF electric field generated around the conductive rod from coupling with the at least one of the first and second wiring members; and,
   wherein the conductive rod is electrically connected to an RF power source via the conductive socket which is electrically insulated from the columnar member.

2. The wafer support according to claim 1, wherein the wiring members for the at least one heater electrode include a low pass filter between the at least one heater electrode and an external power supply.

3. The wafer support according to claim 1, wherein the shield sheet is a planar member made of a mesh, a punching metal, or a metal plate, and
   the conductive mesh shield pipe is made of a punching metal or a metal plate.

4. The wafer support according to claim 1, wherein the plasma generation electrode is an electrode for applying a voltage of the RF power source, or a ground electrode.

5. The wafer support according to claim 1, wherein a frequency of an RF current flowing in the plasma generation electrode is 13 MHz or higher.

* * * * *